US007378835B2

(12) United States Patent
Reimund et al.

(10) Patent No.: US 7,378,835 B2
(45) Date of Patent: May 27, 2008

(54) INTERLEAVED DIFFERENTIAL MULTIPLEXER

(75) Inventors: James A. Reimund, Georgetown, TX (US); Steven D. Geymer, Cedar Park, TX (US); Jason P. White, Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 11/422,819

(22) Filed: Jun. 7, 2006

(65) Prior Publication Data

US 2007/0296401 A1 Dec. 27, 2007

(51) Int. Cl.
*G01R 31/28* (2006.01)
(52) U.S. Cl. .................................. 324/158.1
(58) Field of Classification Search ............. 324/158.1, 324/763; 307/48–50; 320/121; 200/5 R
See application file for complete search history.

(56) References Cited

U.S. PATENT DOCUMENTS

| 1,123,275 | A | * | 1/1915 | Gugler et al. ................ 320/121 |
| 3,711,834 | A | * | 1/1973 | Rogers ..................... 340/14.69 |
| 4,280,097 | A | * | 7/1981 | Carey et al. ................. 324/434 |
| 4,724,319 | A | * | 2/1988 | Shirota ........................ 250/307 |
| 5,426,396 | A | | 6/1995 | Bee |
| 5,838,163 | A | * | 11/1998 | Rostoker et al. ............. 324/763 |
| 5,886,503 | A | * | 3/1999 | McAndrews et al. ........ 320/121 |
| 6,188,339 | B1 | | 2/2001 | Hasegawa |
| 6,310,509 | B1 | | 10/2001 | Davenport et al. |
| 6,339,313 | B1 | * | 1/2002 | Adams et al. ............... 320/121 |
| RE37,619 | E | | 4/2002 | Mercer et al. |
| 6,433,722 | B1 | | 8/2002 | Gata et al. |
| 6,720,818 | B1 | | 4/2004 | Liu et al. |
| 6,844,741 | B2 | * | 1/2005 | McGaha ...................... 324/644 |
| 2006/0061390 | A1 | | 3/2006 | Tam |
| 2007/0001651 | A1 | * | 1/2007 | Harvey ........................ 320/166 |

OTHER PUBLICATIONS

Matthew Steinbroner; "Something New Under the Sun"; Evaluation Engineering; Mar. 2002; pp. 12-16.

* cited by examiner

*Primary Examiner*—Ha Nguyen
*Assistant Examiner*—Joshua Benitez
(74) *Attorney, Agent, or Firm*—Meyertons Hood Kivlin Kowert & Goetzel, P.C.; Jeffrey C. Hood

(57) ABSTRACT

An N-wire interleaved differential multiplexer. The N-wire interleaved differential multiplexer may be formed by interleaving the channels and corresponding switches of N one-wire multiplexers. Each of the switches of the interleaved differential multiplexer may be controlled independent from the other switches to provide a signal path between a DUT stack and a measurement device. To test a first DUT, two switches of the interleaved multiplexer are closed to connect the terminals of the first DUT to the measurement device. To switch from testing the first DUT to testing a subsequent DUT, one of the previously activated switches is opened, one is kept closed, and a different switch is closed. The testing process may "walk" up or down the switch channels of the interleaved multiplexer one switch at a time to test each of the DUTs of the DUT stack.

24 Claims, 2 Drawing Sheets

INTERLEAVED DIFFERENTIAL MULTIPLEXER

BACKGROUND OF THE INVENTION

1. Field of the Invention

This invention relates to switching devices and, more particularly, to an interleaved differential switching apparatus.

2. Description of the Related Art

Typically, a traditional 2-wire differential switch module is used to test circuits that include several devices under test (DUTs) linked in series, such as battery stacks and fuel cell stacks. Traditional 2-wire differential switch modules usually include 2-wire channels that connect to common nodes between the DUTs. In this design, the two wires of each channel connect to a common node between two of the DUTs; therefore, each of the common nodes has two redundant connections.

The 2-wire channels are typically implemented using double-pole, single throw (DPST) switches, which means that two switch contacts are controlled by a single coil and cannot be operated independently. When switching from testing one DUT to another, the two switch contacts corresponding to the active 2-wire channel need to be deactivated, and then two other switch contacts corresponding to another 2-wire channel need to be activated. Since DPST switches are used, each 2-wire channel in this configuration requires 2 switch contacts. Therefore, traditional 2-wire differential switches may contain redundant switch contacts, which increase the size and cost of the switch module.

Many other problems and disadvantages of the prior art will become apparent to one skilled in the art after comparing such prior art with the present invention as described herein.

SUMMARY OF THE INVENTION

Various embodiments are disclosed of a switching apparatus including an interleaved differential multiplexer. The switching apparatus may include a plurality of channels and a plurality of corresponding switches. The switches may be configured as single-pole, single throw (SPST) switches.

In various embodiments, the switching apparatus may include a two-wire, interleaved differential multiplexer, which may be formed by interleaving two, one-wire multiplexers. Specifically, a first multiplexer that includes a plurality of channels and corresponding switches may be interleaved with a second multiplexer that includes a plurality of channels and corresponding switches.

Furthermore, the switching apparatus may include a plurality of primary terminals or connectors that may be used to connect to a DUT stack, e.g., a battery stack, during a test process. Each channel of the first and second multiplexers may be connected to a different primary terminal. The switching apparatus may also include a plurality of common secondary terminals or connector that may be used to connect to a measurement device, e.g., a DMM. Each of the channels corresponding to the first multiplexer may be connected to a first common secondary terminal, and each of the channels corresponding to the second multiplexer may be connected to a second common secondary terminal.

During testing, each of the switches of the switching apparatus may be controlled independent from the other switches to provide a signal path between the DUT stack and the measurement device. In various embodiments, to test a first DUT located between a first connection point and a second connection point of the DUT stack, the switch that is connected to the first connection point and the switch that is coupled to the second connection point are closed (activated) to connect the terminals of the first DUT to measurement device. To switch from testing the first DUT to testing a subsequent DUT located between the second connection point and a third connection point of the DUT stack, the switch that is connected to the first connection point is opened (deactivated), the switch that is connected to the second connection point is kept closed (active), and the switch that is coupled to the third connection point is closed (activated). In these embodiments, the testing process may "walk" up or down the switch channels of the switching apparatus one switch at a time to test each of the DUTs of the DUT stack.

In various embodiments, the switching apparatus may include N (i.e., two or more) one-wire multiplexers, each including a plurality of channels and corresponding switches. In these embodiments, the channels and corresponding switches of the N multiplexers may be interleaved to form an N-wire, interleaved multiplexer.

Figure 1:
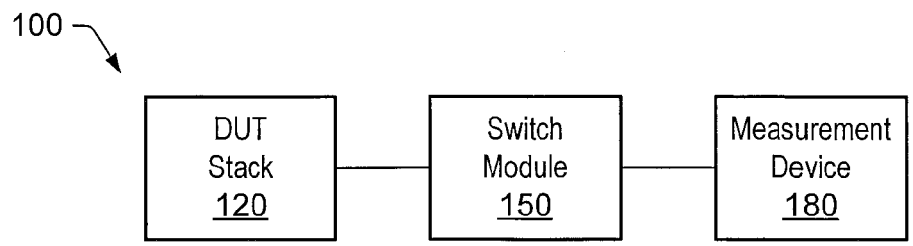
FIG. 1 is a block diagram of one embodiment of a test system including an interleaved differential multiplexer module.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

FIG. 1 is a block diagram of one embodiment of a test system 100. Test system 100 may include a DUT stack 120, a switch module 150, and a measurement device 180. DUT stack 120 may include a plurality of devices connected to each other in series. For instance, in various embodiments, DUT stack 120 may be a battery stack or a fuel cell stack. It is noted, however, that depending on the application in other embodiments the DUTs may be other types of devices, such as a stack of resistive devices or a stack of capacitive devices.

Measurement device 180 may be a device configured to receive and processes measurements from at least one DUT, e.g., a digital multimeter (DMM), and provide the test results to a user. Measurement device 180 may also include a signal source for providing test signals to the DUT stack

120 to test each of the DUTs. Measurement device 180 may be configured as a computer-based instrument or a stand-alone instrument. In one embodiment, measurement device 180 may include or may be connected to a computer system, which may be any of various types of computing or processing systems, including a personal computer system (PC), mainframe computer system, server system including a plurality of server blades, workstation, network appliance, Internet appliance, personal digital assistant (PDA), or other device or combinations of devices. In general, the term "computer system" can be broadly defined to encompass any device (or combination of devices) having at least one processor that executes instructions from a memory medium.

Switch module 150 may include a plurality of channels and switches for providing a signal path between the DUT stack 120 and the measurement device 180, e.g., to obtain test measurements from the DUT stack 120 and to send test signals from the measurement device 180 to the DUT stack 120. In various embodiments, switch module 150 may be connected to a computer system, e.g., a computer system including measurement device 180. In numerous applications, each device in the DUT stack 120 (e.g., a battery stack) may need to be tested individually to characterize the device. Switch module 150 may be used to switch in the DUTs one at a time to perform the test in an efficient and cost-effective manner, as will be described further below with reference to FIGS. 2 and 3.

Figure 2:
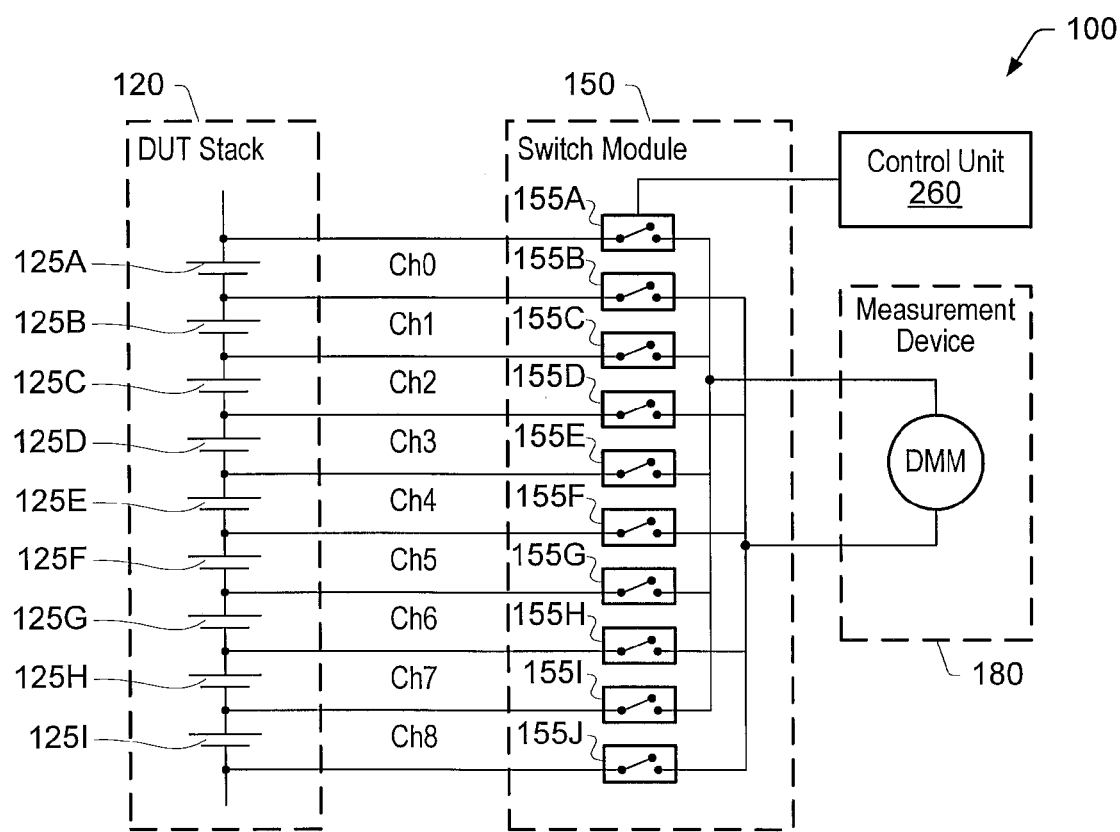
FIG. 2 is a block diagram of one embodiment of the interleaved differential multiplexer module of FIG. 1.

FIG. 2 is a block diagram of one embodiment of switch module 150. Switch module 150 may be connected between DUT stack 120 and measurement device 180. In the illustrated embodiment of FIG. 2, DUT stack 120 is shown as a battery stack and measurement device 180 is shown as a DMM. As noted above with reference to FIG. 1, in other embodiments, the type of devices included in DUT stack 120 and the type of measurement device 180 may vary depending on the application.

Switch module 150 may include a plurality of channels, e.g., Ch0-Ch8, and a plurality of switches, e.g., switches 155A-155J. In various embodiments, the switches may be configured as single-pole, single throw (SPST) switches. A control unit 260 may be connected to switch module 150 to control the state of the switches 155. In some embodiments, control unit 260 may be implemented in software and/or hardware, e.g., in a computer system or a computer-based instrument.

Switch module 150 may be configured as a two-wire interleaved differential multiplexer. In various embodiments, the two-wire interleaved differential multiplexer design may be formed by interleaving two, one-wire multiplexers. For instance, as illustrated in the embodiment of FIG. 2, a first multiplexer that includes a plurality of channels and the corresponding switches 155A, 155C, 155E, 155G, and 155I may be interleaved with a second multiplexer that includes a plurality of channels and the corresponding switches 155B, 155D, 155F, 155H, and 155J to form the two-wire interleaved differential multiplexer of switch module 150. The two-wire interleaved differential multiplexer includes a plurality of differential (2-wire) channels, e.g., CH0-CH8.

As illustrated in the embodiment of FIG. 2, each of the first and second one-wire multiplexers that form the interleaved design has one-wire channels that connect to a single SPST switch (e.g., 155A). In this embodiment, the two-wire interleaved differential multiplexer, however, has two-wire channels (e.g., CH0-CH8), each wire corresponding to a single SPST switch. In various embodiments, each of the two-wire channels of the interleaved design is formed using one of the wires (i.e., one-wire channels) of the first multiplexer and one of the wires (i.e., one-wire channels) of the second multiplexer. It is noted, however, that in other embodiments the interleaved differential multiplexer may have other configurations, e.g., the interleaved design may be formed by interleaving the channels (and corresponding switches) from three or more multiplexers. It is further noted that the multiplexers that form the interleaved design may be included within the same switch module or circuit board, or may be separate switch modules that may be located in different circuit boards.

Furthermore, switch module 150 includes a plurality of primary terminals or connectors that are used to connect to DUT stack 120. Each of the channels corresponding to the first and second multiplexers of switch module 150 is connected to a different primary terminal. Switch module 150 also includes a first common secondary terminal and a second common secondary terminal that are used to connect to measurement device 180. Each of the channels corresponding to the first multiplexer is connected to the first common secondary terminal, and each of the channels corresponding to the second multiplexer is connected to the second common secondary terminal. It is noted that switch module 150 may be a switch apparatus having other configurations, e.g., may be formed from two or more switch modules or circuit boards.

DUT stack 120 may include a plurality of DUTs, e.g., DUTs 125A-125I. In various embodiments, each of the DUTs 125 includes at least two terminals, and the DUTs 125 may be connected to each other in series. The series arrangement of DUTs 125 includes a plurality of connection points that are used to connect to the channels of switch module 150, e.g., to provide test measurements to measurement device 180. Some of the connection points are located between adjacent DUTs 125. Each of these connection points is a junction of a terminal from one DUT and a terminal from another DUT. For example, the connection point between DUT 125B and DUT 125C is a junction of one terminal from DUT 125B and one terminal from DUT 125C. Other connection points connect to only one terminal of a DUT 125. These connection points may be at the ends of DUT stack 120 and are used to measure the first DUT and the last DUT of the stack 120. For example, the connection point corresponding to switch 155A is used to test DUT 125A and the connection point corresponding to 155J is used to test DUT 125I.

When the DUT stack 120 is connected to switch module 150, the channels of the first multiplexer are connected to every other connection point of the DUT stack 120, and the channels of the second multiplexer are connected to the remaining connection points of the DUT stack 120 (also in an alternating fashion). For each DUT 125, this arrangement results in one channel (and switch) from the first multiplexer being connected to one of the terminals of a particular DUT 125 (e.g., DUT 125D), and one channel (and switch) from the second multiplexer being connected to the other terminal of the DUT 125 (e.g., DUT 125D). Also, in this arrangement, each of the connection points connects to a single channel and a single switch contact of the switch module 150.

During operation, testing may begin from the top of DUT stack 120. In other words, DUT 125A may be tested first. In some implementations, testing may begin from either the top or the bottom of DUT stack 120. It is noted, however, that in other implementations testing may begin with any of the DUTs 125.

To test DUT 125A, switches 155A and 155B are closed (activated) to make the connection to measurement device 180 (e.g., a DMM). By closing switch 155A, the first connection point associated with DUT 125A is connected to one of the input terminals of measurement device 180 and the second connection point associated with DUT 125A is connected to the other input terminal of measurement device 180. By closing switches 155A and 155B, channel Ch0 is connected. To measure the next DUT (DUT 125B), switch 155A is opened (deactivated), switch 155B is kept closed, and switch 155C is closed, which causes channel Ch1 to be connected. Similarly, to measure DUT 125C, switch 155B is opened, switch 155C is kept closed, and switch 155D is closed, which causes channel Ch2 to be connected. This process continues for each DUT 125 in the stack 120.

In other words, to test a first DUT 125 located between a first connection point and a second connection point, the switch that is connected to the first connection point and the switch that is coupled to the second connection point are closed (activated) to connect the terminals of the first DUT 125 to measurement device 180. To switch from testing the first DUT to testing a second DUT located between the second connection point and a third connection point, the switch that is connected to the first connection point is opened (deactivated), the switch that is connected to the second connection point is kept closed (active), and the switch that is coupled to the third connection point is closed (activated). As described above, in various embodiments, control unit 260 may control the state of each of the switches 155 independently during the testing process.

Note that to switch from testing one DUT to a different DUT, only one "new" switch needs to be closed, since one of the previously closed switches remains closed. Therefore, during testing, the switches 155 are operated in a manner that "walks" up or down the stack 120. Measurement device 180 will effectively be swapping its polarity at each measurement step as the process walks up/down through the switch channels. Specifically, when measuring a first DUT 125 (e.g., DUT 125A), the positive terminal of the DUT is connected to the positive terminal of measurement device 180 and the negative terminal of the DUT is connected to the negative terminal of measurement device 180. However, when a subsequent DUT is tested (e.g., DUT 125B), the negative terminal of the DUT is now connected to the positive terminal of measurement device 180 and the positive terminal of the DUT is connected to the negative terminal of measurement device 180. In various embodiments, this change in sign of the measurement data may be corrected during a post-process step by which the data is modified by software to swap the sign of every other measurement.

It should be noted that the components described with reference to FIG. 2 are meant to be exemplary only, and are not intended to limit the invention to any specific set of components or configurations. For example, in various embodiments, one or more of the components described may be omitted, combined, modified, or additional components included, as desired.

Figure 3:
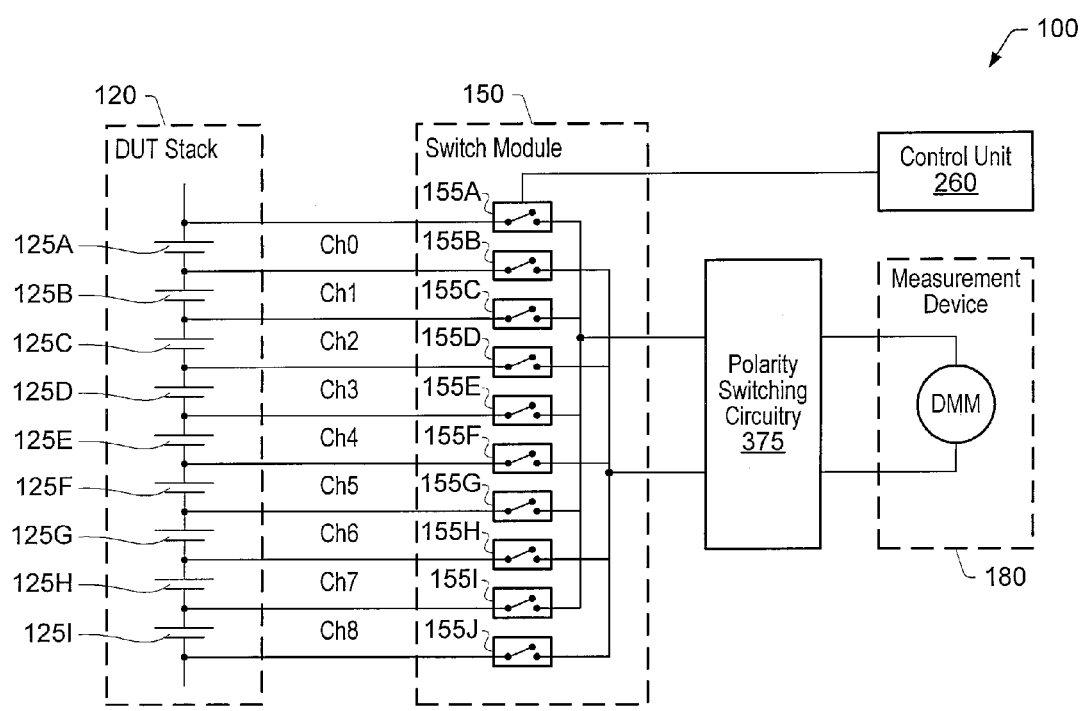
FIG. 3 is a block diagram of another embodiment of the interleaved differential multiplexer module of FIG. 1.

For instance, as shown in the embodiment of FIG. 3, system 100 may be modified to include polarity switching circuitry 375 between switch module 150 and measurement device 180 to swap the sign of every other measurement during the testing process. Polarity switching circuitry 375 may swap the polarity using an additional set of switches. Therefore, in various embodiments, the polarity of the measurements may be swapped by software and/or hardware.

In some embodiments, to test two or more DUT stacks 120, two or more switch modules 150 may be connected in series. The DUT stacks 120 and the switch modules 150 may link together in a manner that the testing process described above remains the same. Specifically, the last switch of the first switch module and the first switch of the second switch module may be activated to test the first DUT of the second module, thereby forming an additional 2-wire channel between the two switch modules.

In various embodiments, for an N-wire measurement system, the channels and corresponding SPST switches of N multiplexers may be interleaved similarly as described above to form an N-wire interleaved multiplexer. For instance, a 4-wire interleaved multiplexer may be formed by interleaving four, one-wire multiplexers, and a 6-wire interleaved multiplexer may be formed by interleaving six, one-wire multiplexers. It is noted, however, that in other embodiments an N-wire interleaved multiplexer may have other configurations.

As described above, the channels associated with the interleaved multiplexer may be bi-directional, e.g., may be used by measurement device 180 to obtain test measurements from the DUTs 125, and may be used to provide test signals from measurement device 180 to DUTs 125. It is noted that in some embodiments a subset of the channels (and corresponding switches) of the interleaved multiplexer may be used to obtain test measurements from DUT stack 120, while the remaining channels may be used to provide test signals to DUT stack 120. For example, in a 4-wire measurement system including a 4-wire interleaved multiplexer, measurement device 180 may use two of the four wires to obtain measurements from DUT stack 120, and may use the remaining two wires to provide a test signal (e.g., a test current) to DUT stack 120.

In the illustrated embodiments of FIG. 2 and FIG. 3, the interleaved switching technique described above may use two-wire channels to test a particular DUT 125. Each of the wires associated with each two-wire channel connects to a single switch 155 (e.g., a SPST switch) that is independently controlled. Because the switches 155 are operated independently, each channel may share a switch contact with an adjacent channel thereby reducing the number of total switch contacts required. In the traditional approach described above, DPST switches (switches with 2 contacts) may be used and a separate switch may be required for each 2-wire channel. A switching module built using this traditional approach thus may require the same number of 2-wire switches as 2-wire channels and twice that many switch contacts (since each DPST switch has two contacts).

Besides improving overall switch usage and channel count on a single switch module, the interleaved topology and method described above with reference to the embodiments of FIGS. 1-3 also has other advantages over the traditional approach. First, when used in a multi-module configuration, the last switch on one switch module may be chained to the first switch on the next switch module providing an additional channel. For a system with m switch modules, using the interleaved topology each with n switches, they may be combined together to form a total of mn-1 differential (two-wire) channels.

Second, since each connection point in the DUTs 125 is connected to the corresponding channel of the switch module 150 using one wire, the interleaved design may require less wiring to connect to the DUT stack 120 than the traditional approach. In the traditional approach, two wires are typically used to connect a pair of redundant connection points to each two-wire channel of the switch module. The extra wiring used in the traditional approach may result in higher connectivity hassle and cost.

Additionally, by switching only a single switch contact at a time, the process keeps one end of the channel pair connected to measurement device 180. Because this keeps one terminal of the measurement device connected to a reference voltage that is closer to the potential of the newly connected terminal, measurement device 180 may only make small steps between measurements, which reduces its settling time, thereby increasing overall measurement throughput.

Furthermore, the interleaved design and test method helps reduce radiated emission caused by switching high voltages. In a system using the traditional approach, the voltage being switched may depend on the common mode voltage of the DUT being measured. The interleaved method allows measurement device 180 to float along with the DUT being measured. At the high end of an n DUT stack, where each DUT has a voltage v, a traditional switching arrangement may swing from 0 to nv volts. If v is large, this voltage spike may produce large amounts of radiated emissions. Because one end of the channel pair stays referenced using the interleaved method, the voltage switched may be limited to 2v. Thus, in the interleaved design less noise may be created than in the traditional approach since the energy stored in the system prior to switching is significantly lower. For example, since energy here is proportional to the square of the voltage, for a traditional setup, a 500-volt stack with cell voltages of 5V could store up to 2500 times more energy than the interleaved method.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A switching apparatus comprising:
   a first multiplexer including a first plurality of channels and a first plurality of switches, wherein each of the first plurality of channels includes a respective one of the first plurality of switches;
   a second multiplexer including a second plurality of channels and a second plurality of switches, wherein each of the second portion of the plurality of channels includes one of the second portion of the plurality of switches;
   a plurality of primary terminals, wherein each respective one of the plurality of channels of the first and second multiplexers is coupled to a different one of the plurality of primary terminals, and wherein the first plurality of channels are coupled to different ones of the plurality of primary terminals than the second plurality of channels; and
   a first common secondary terminal and a second common secondary terminal, wherein each of the first plurality of channels is coupled to the first common secondary terminal, and each of the second plurality of channels is coupled to the second common secondary terminal;
   wherein the first plurality of channels are interleaved with the second plurality of channels to form a two-wire interleaved differential multiplexer including a plurality of two-wire channels; and
   wherein the switching apparatus is configured to couple to a plurality of devices under test (DUTs) via the plurality of primary terminals and to a measurement device via the first and second common secondary terminals, wherein the switching apparatus is configured to provide a signal path between the DUTs and the measurement device to test the DUTs.

2. The switching apparatus of claim 1, wherein each of the first and second plurality of switches of the first and second multiplexers are controlled independent of the other switches.

3. The switching apparatus of claim 1, wherein each of the DUTs includes at least two terminals, wherein the DUTs are coupled to each other in series, wherein the coupling of the DUTs includes a plurality of connection points, wherein each of the connection points is coupled to one of the terminals of one or more of the DUTs.

4. The switching apparatus of claim 3, wherein the first plurality of channels are coupled to every other connection point associated with the DUTs, and the second plurality of channels are coupled to the remaining connection points.

5. The switching apparatus of claim 4, wherein each of the connection points is coupled to a single switch contact corresponding to the first and second plurality of switches of the first and second multiplexers.

6. The switching apparatus of claim 1, wherein the switching apparatus is configured to couple to a plurality of DUTs via the plurality of primary terminals and to a signal source via the first and second common secondary terminals, wherein the switching apparatus is configured to provide test signals from the signal source to the DUTs to test the DUTs.

7. The switching apparatus of claim 1, wherein the switches are single-pole, single throw (SPST) switches.

8. The switching apparatus of claim 1, wherein the two-wire interleaved differential multiplexer reduces radiated emissions during switching operations.

9. The switching apparatus of claim 1, comprising N multiplexers, each including a plurality of channels and corresponding switches, wherein the channels of each of the N multiplexers are interleaved to form an N-wire interleaved multiplexer.

10. A system comprising:
    a plurality of devices under test (DUTs);
    a measurement device configured to test the DUTs;
    a switching apparatus coupled between the DUTs and the measurement device, wherein the switching apparatus is configured to provide a signal path between the DUTs and the measurement device to test the DUTs, wherein the switching apparatus includes:
    a first multiplexer including a first plurality of channels and a first plurality of switches, wherein each of the first plurality of channels includes one of the first plurality of switches;
    a second multiplexer including a second plurality of channels and a second plurality of switches, wherein each of the second plurality of channels includes one of the second plurality of switches;
    a plurality of primary terminals coupled to the DUTs, wherein each of the first and second plurality of channels is coupled to a different one of the plurality of primary terminals, and wherein the first plurality of channels are coupled to different ones of the plurality of primary terminals than the second plurality of channels; and
    a first common secondary terminal and a second common secondary terminal coupled to the measurement device, wherein each of the first plurality of channels is coupled to the first common secondary terminal, and each of the second plurality of channels is coupled to the second common secondary terminal;

wherein the first plurality of channels are interleaved with the second plurality of channels to form a two-wire interleaved differential multiplexer including a plurality of two-wire channels.

11. The system of claim 10, further comprising a control unit configured to control the state of the first and second plurality of switches of the first and second multiplexers, wherein the control unit is configured to control each of the switches independent of the other switches.

12. The system of claim 10, wherein each of the DUTs includes at least two terminals, wherein the DUTs are coupled to each other in series, wherein the coupling of the DUTs includes a plurality of connection points, wherein each of the connection points is coupled to one of the terminals of one or more of the DUTs.

13. The system of claim 12, wherein the first plurality of channels are coupled to every other connection point associated with the DUTs, and the second plurality of channels are coupled to the remaining connection points.

14. The system of claim 13, wherein each of the connection points is coupled to a single switch contact corresponding to the first and second plurality of switches of the first and second multiplexers.

15. The system of claim 13, wherein, to test one of the DUTs, the switch coupled to the connection point corresponding to one of the terminals of the DUT and the switch coupled to another connection point corresponding to another one of the terminals of the DUT are activated.

16. The system of claim 15, wherein, to switch from testing the one DUT to testing a subsequent DUT, one of the two active switches is deactivated, the active state of the remaining one of the two active switches is maintained, and the switch coupled to a subsequent connection point corresponding to one of the terminals of the subsequent DUT is activated.

17. The system of claim 13, wherein, to test a first DUT located between a first connection point and a second connection point, the switch of the first multiplexer that is coupled to the first connection point and the switch of the second multiplexer that is coupled to the second connection point are activated.

18. The system of claim 17, wherein, to switch from testing the first DUT to testing a second DUT located between the second connection point and a third connection point, the switch of the first multiplexer that is coupled to the first connection point is deactivated, the active state of the switch of the second multiplexer that is coupled to the second connection point is maintained, and the switch of the first multiplexer that is coupled to the third connection point is activated.

19. The system of claim 10, wherein the two-wire interleaved differential multiplexer reduces radiated emissions during switching operations.

20. The system of claim 10, wherein the DUTs comprise at least one of a stack of batteries, a stack of fuel cells, a stack of resistive devices, and a stack of capacitive devices.

21. The system of claim 10, further comprising one or more additional switching apparatus coupled to each other in series to test additional DUTs.

22. The system of claim 10, wherein the switching apparatus comprises N multiplexers, each including a plurality of channels and corresponding switches, wherein the channels of each of the N multiplexers are interleaved to form an N-wire interleaved multiplexer.

23. A method for testing a plurality of devices under test (DUTs) using a switching apparatus and a measurement device, the method comprising:
providing the switching apparatus, the measurement device, and the plurality of DUTs, wherein each of the DUTs includes at least two terminals, wherein the DUTs are coupled to each other in series, wherein the coupling of the DUTs includes a plurality of connection points, wherein each of the connection points is coupled to one of the terminals of one or more of the DUTs;
coupling the DUTs to the switching apparatus, wherein the switching apparatus comprises:
a first multiplexer including a first plurality of channels and a first plurality of switches, wherein each of the first plurality of channels includes one of the first plurality of switches;
a second multiplexer including a second plurality of channels and a second plurality of switches, wherein each of the second plurality of channels includes one of the second plurality of switches;
a plurality of primary terminals coupled to the DUTs, wherein each of the first and second plurality of channels is coupled to a different one of the plurality of primary terminals; and
a first common secondary terminal and a second common secondary terminal, wherein each of the first plurality of channels is coupled to the first common secondary terminal, and each of the second plurality of channels is coupled to the second common secondary terminal;
wherein the first plurality of channels are interleaved with the second plurality of channels to form a two-wire interleaved differential multiplexer including a plurality of two-wire channels, wherein the first plurality of channels are coupled to every other connection point associated with the DUTs, and the second plurality of channels are coupled to the remaining connection points associated with the DUTs; and
coupling the first common secondary terminal and the second common secondary terminal of the switching apparatus to the measurement device.

24. The method of claim 23, wherein:
to test a first DUT located between a first connection point and a second connection point, activating the switch of the first multiplexer that is coupled to the first connection point and the switch of the second multiplexer that is coupled to the second connection point; and
to switch from testing the first DUT to testing a second DUT located between the second connection point and a third connection point, deactivating the switch of the first multiplexer that is coupled to the first connection point, maintaining the active state of the switch of the second multiplexer that is coupled to the second connection point, and activating the switch of the first multiplexer that is coupled to the third connection point.

* * * * *